United States Patent
Baek et al.

(10) Patent No.: US 9,305,979 B2
(45) Date of Patent: Apr. 5, 2016

(54) ORGANIC LIGHT EMITTING DIODE DISPLAY DEVICE AND METHOD OF FABRICATING THE SAME

(71) Applicant: LG Display Co., Ltd., Seoul (KR)

(72) Inventors: Heume-Il Baek, Gyeonggi-do (KR); Ji-Heun Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 282 days.

(21) Appl. No.: 13/973,275

(22) Filed: Aug. 22, 2013

(65) Prior Publication Data

US 2014/0183464 A1    Jul. 3, 2014

(30) Foreign Application Priority Data

Dec. 27, 2012  (KR) .................. 10-2012-0155239
Jul. 19, 2013  (KR) .................. 10-2013-0085411

(51) Int. Cl.
*H01L 21/00*    (2006.01)
*H01L 27/32*    (2006.01)
*H01L 51/52*    (2006.01)

(52) U.S. Cl.
CPC ........ *H01L 27/3213* (2013.01); *H01L 51/5218* (2013.01); *H01L 51/5231* (2013.01); *H01L 27/3244* (2013.01); *H01L 2227/323* (2013.01)

(58) Field of Classification Search
CPC ............ H01L 27/3213; H01L 51/5218; H01L 51/5231; H01L 2227/323
See application file for complete search history.

(56) References Cited

U.S. PATENT DOCUMENTS

| 2005/0088081 | A1 | 4/2005 | Nishikawa et al. |
| 2005/0142976 | A1 | 6/2005 | Suzuki |
| 2005/0280008 | A1 | 12/2005 | Ricks et al. |
| 2010/0090620 | A1 | 4/2010 | Hack et al. |
| 2013/0105778 | A1* | 5/2013 | Kim .................. H01L 27/3213 257/40 |

FOREIGN PATENT DOCUMENTS

| CN | 1604710 A | 4/2005 |
| CN | 1638547 A | 7/2005 |
| CN | 102224591 A | 10/2011 |

(Continued)

OTHER PUBLICATIONS

Office Action dated Oct. 14, 2015 from the Taiwan Patent Office in counterpart Taiwanese application No. 102128697.
The First Office Action dated Dec. 25, 2015 from the State Intellectual Property Office of the People's Republic of China in counterpart Chinese application No. 201310364408.2.

(Continued)

*Primary Examiner* — Laura Menz
(74) *Attorney, Agent, or Firm* — Morgan, Lewis & Bockius LLP (57) ABSTRACT

An OLED display device includes a substrate; pixel regions defined by gate and data lines, each pixel region including red, green, first blue and second blue sub-pixels; a TFT in each pixel region; a first electrode connected to the thin film transistor; an insulating layer exposing the first electrode; hole injecting and hole transporting layers stacked on the first electrode; red, green and blue emitting layer on the hole transporting layer, the red and green emitting layers respectively being in the red and green sub-pixels, and the blue emitting layer being in the first and second blue sub-pixels; electron transporting and electron injecting layers stacked on the red, green and blue emitting layers; and a second electrode on the insulating layer and the electron injecting layer, wherein the first electrode in the second blue sub-pixel has a multi-layered structure of the first electrode layer and at least one metal layer.

22 Claims, 6 Drawing Sheets

(56) References Cited

FOREIGN PATENT DOCUMENTS

| | | |
|---|---|---|
| TW | 200513147 | 4/2005 |
| TW | 200522792 A | 7/2005 |
| TW | 201031255 A | 8/2010 |

OTHER PUBLICATIONS

So et al., Power Efficient AMOLED Display with Novel Four Sub-Pixel Architecture and Driving Scheme, SID 10 Digest, pp. 622-625, 2010.

* cited by examiner

FIG. 1

RELATED ART

ORGANIC LIGHT EMITTING DIODE DISPLAY DEVICE AND METHOD OF FABRICATING THE SAME

The present application claims the priority benefit of Korean Patent Application Nos. 10-2012-0155239 and 10-2013-0085411, filed in Republic of Korea on Dec. 27, 2012 and Jul. 19, 2013, respectively, all of which are herein incorporated by reference.

BACKGROUND OF THE INVENTION

1. Technical Field

The present invention relates to an organic light emitting diode (OLED) display device, and more particularly, to an OLED display device including four color emitting layers and method of fabricating the OLED display device.

2. Related Art

An OLED display device of new flat panel display devices is a self-emitting type. Since the OLED display device does not require a backlight, which is required for a liquid crystal display device, the OLED device has a thin profile and light weight.

Particularly, various colors, e.g., red, green, blue, cyan, light-blue, and so on, can be displayed using an organic material. The red and green phosphorescent materials having excellent efficiency and lifetime are used, while the deep-blue fluorescent material having similar color property and lifetime as the red and green phosphorescent materials are used. However, the deep-blue fluorescent material has low efficiency such that there is a disadvantage in power consumption.

Figure 1:
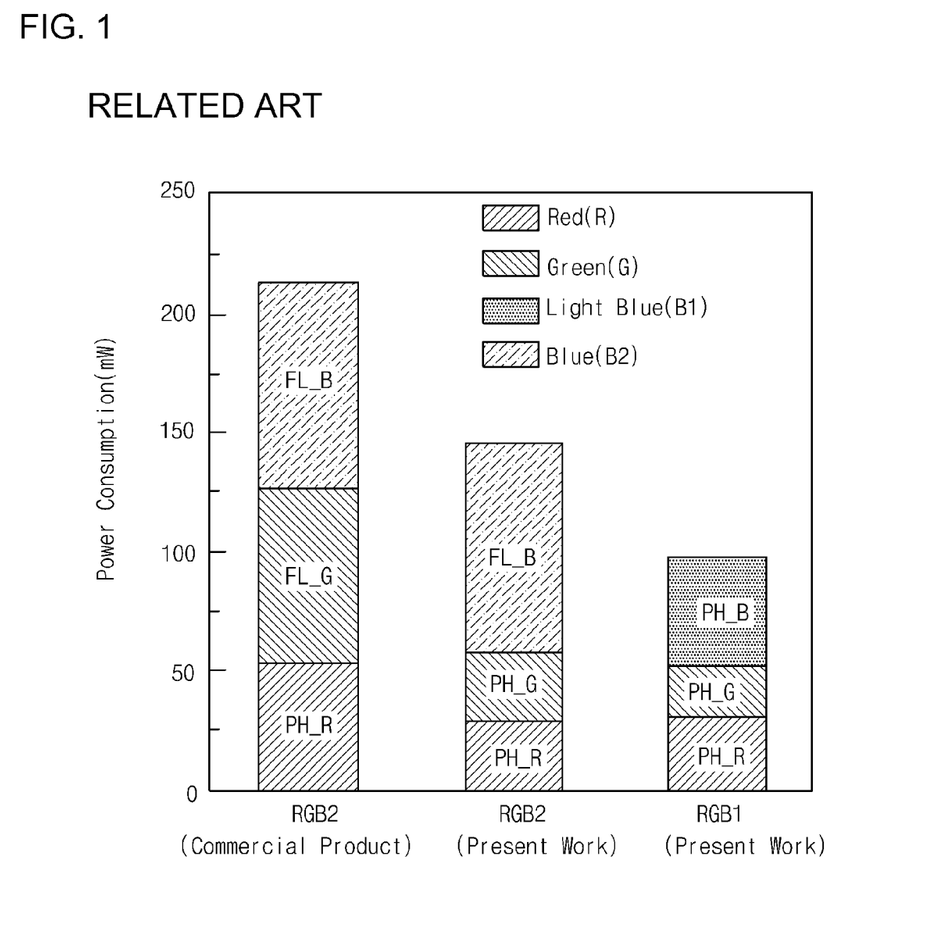
FIG. 1 shows power consumption according to materials of an emitting material for the OLED display device.

FIG. 1 is a graph of simulation data for showing power consumption in an OLED display device using a red phosphorescent material PH_R, a green fluorescent material FL_G, a green phosphorescent material PH_G, a blue phosphorescent material PH_B1 and a blue fluorescent material FL_B2.

FIG. 1 shows power consumption of the OLED display device, which uses the red phosphorescent material PH_R, the green phosphorescent material PH_G and the blue phosphorescent material PH_B1, is decreased by about 45% in comparison to the OLED, which uses the red phosphorescent material PH_R, the green phosphorescent material PH_G and the blue fluorescent material FL_B2.

Figure 2:
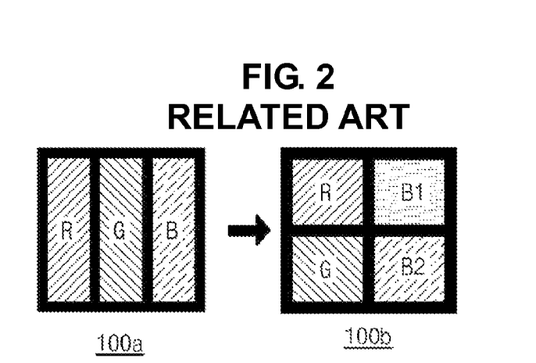
FIG. 2 is a schematic plane view of the sub-pixel arrangement in the related art OLED device.

FIG. 2 is a schematic plane view of the sub-pixel arrangement in the related art OLED device.

In FIG. 2, one pixel 100a includes red, green and blue sub-pixels R, G and B. On the other hand, another pixel 100b includes the red sub-pixel R, the green sub-pixel G, a light-blue sub-pixel B1 of a phosphorescent material and a deep-blue sub-pixel B2 of the fluorescent material to prevent a problem of power consumption increase resulted from the fluorescent material.

In addition, to display images, the light-blue material is used above 70%, and the deep-blue material is used below 30%. The light-blue image is displayed using the phosphorescent material, while the deep-blue is displayed using the fluorescent material. Accordingly, the four emitting materials and four deposition processes are required to fabricate the OLED display device having the pixel 100b.

Figure 3:
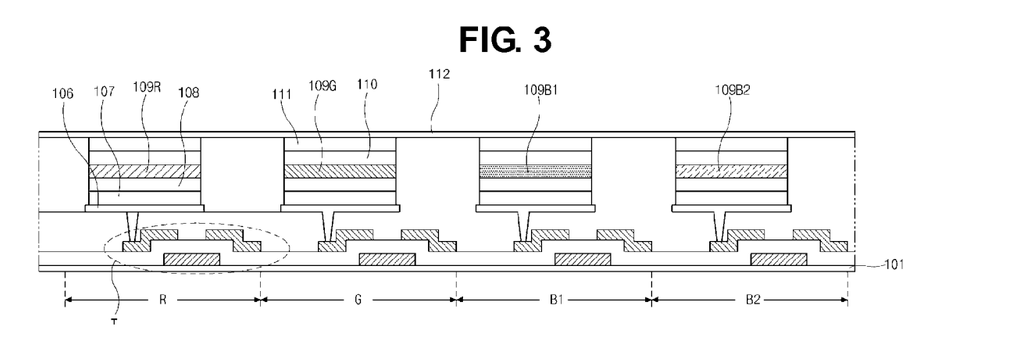
FIG. 3 is a schematic cross-sectional view of the related art OLED display device including red, green, first blue and second blue sub-pixels.

Referring to FIG. 3, which is a schematic cross-sectional view of the related art OLED display device including red, green, first blue and second blue sub-pixels, a fabricating process of the OLED display device is explained.

As shown in FIG. 3, the OLED display device includes an organic emitting cell. The organic emitting cell includes a first electrode 106 connected to a thin film transistor (TFT) T, which is formed on a substrate 101, a hole injecting layer 107, a hole transporting layer 108, an emitting layer 109, an electron transporting layer 110, an electron injecting layer 111, and a second electrode 112. The hole injecting layer 107, the hole transporting layer 108, the emitting layer 109, the electron transporting layer 110, the electron injecting layer 111, and the second electrode 112 are stacked on the first electrode 106.

Particularly, after forming the TFT T on the substrate 101, the first electrode 106, the hole injecting layer 107 and the hole transporting layer 108 are formed. Next, the red emitting layer 109R, the green emitting layer 109G, the light-blue emitting layer 109B1 and the deep-blue emitting layer 109B2 are formed in the red sub-pixel R, the green sub-pixel G, the first blue sub-pixel B1 and the second blue sub-pixel B2. To form the four-colored pixel structure, a step of forming the light-blue emitting layer 109B1 or the deep-blue emitting layer 109B2 is further required.

Namely, since the OLED display device having the four-colored pixel structure includes the red, green, first blue and second blue sub-pixels R, G, B1 and B2, production costs and fabricating steps are increased in comparison to the OLED display device having the three-colored pixel structure. In addition, since the fluorescent material is used for displaying the deep-blue, there are still disadvantages in power consumption.

SUMMARY OF THE INVENTION

Accordingly, the present invention is directed to an OLED display device and a method of fabricating the same that substantially obviates one or more of the problems due to limitations and disadvantages of the related art.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

In accordance with the present invention, as embodied and broadly described herein, OLED display device includes a substrate; pixel regions defined by gate lines and data lines formed on the substrate, each pixel region including red, green, first blue and second blue sub-pixels; a thin film transistor in each pixel region; a first electrode electrically connected to a drain electrode of the thin film transistor; an insulating layer exposing the first electrode; a hole injecting layer and a hole transporting layer sequentially stacked on the first electrode; red, green and blue emitting layer on the hole transporting layer, the red and green emitting layers respectively being in the red and green sub-pixels, and the blue emitting layer being in the first and second blue sub-pixels; an electron transporting layer and an electron injecting layer sequentially stacked on the red, green and blue emitting layers; and a second electrode on the insulating layer and the electron injecting layer, wherein the first electrode in the second blue sub-pixel has a multi-layered structure of the first electrode layer and at least one metal layer.

Preferably, the first blue sub-pixel may display a light-blue color, and the second blue sub-pixel may display a deep-blue color.

Preferably, the multi-layered structure may be a double-layered structure of the first electrode layer and a first metal layer under the first electrode layer, and the first metal layer includes Ag or Ag alloy, and wherein the first electrode layer includes ITO or IZO or other transparent conductive materials.

Preferably, the multi-layered structure may be a triple-layered structure of the first electrode layer, a first metal layer on the first electrode layer and a second metal layer on the first metal layer, and each of the first electrode layer and the second metal layer includes ITO or IZO or other transparent conductive materials, and wherein the first metal layer includes Ag or Ag alloy.

Preferably, the first electrode layer may have a thickness more than 0 angstrom and less than about 300 angstroms, and the first metal layer may have a thickness of about 100 to 200 angstroms.

Preferably, the first electrode layer may have a thickness more than 0 angstrom and less than about 300 angstroms, and the first metal layer may have a thickness of about 100 to 200 angstroms, and wherein the second metal layer has a thickness more than 0 angstrom and less than about 100 angstroms.

Preferably, the blue emitting layer in the first and second blue sub-pixels, may include the same blue phosphorescent organic material.

Preferably, the second electrode may include Al.

A substrate for an organic light emitting diode display device, comprising: a substrate; a plurality of pixel regions defined by a plurality of gate lines and a plurality of data lines formed on the substrate, each pixel region including red, green, first blue and second blue sub-pixels; a thin film transistor in each pixel region; a first electrode electrically connected to a drain electrode of the thin film transistor; an insulating layer exposing the first electrode; a hole injecting layer and a hole transporting layer sequentially stacked on the first electrode; red, green and blue emitting layer on the hole transporting layer, the red emitting layer being in the red sub-pixel, the green emitting layer being in the green sub-pixel, and the blue emitting layer being in the first and second blue sub-pixels; an electron transporting layer and an electron injecting layer sequentially stacked on the red, green and blue emitting layers; and a second electrode on the insulating layer and the electron injecting layer, wherein the first electrode in the second blue sub-pixel has a multi-layered structure of the first electrode layer and at least one metal layer.

Preferably, the multi-layered structure may be a double-layered structure of the first electrode layer and a first metal layer under the first electrode layer, or a triple-layered structure of the first electrode layer, a first metal layer on the first electrode layer and a second metal layer on the first metal layer.

Preferably, the blue emitting layer in the first and second blue sub-pixels may include the same blue phosphorescent organic material.

In the another aspect, a method of fabricating an organic light emitting diode display device includes forming a plurality of gate lines and a plurality of data lines to define a plurality of pixel regions, each pixel region including red, green, first blue and second blue sub-pixels; forming a thin film transistor in each pixel region, wherein the first electrode in the second blue sub-pixel has a multi-layered structure of the first electrode layer and at least one metal layer; forming a first electrode electrically connected to a drain electrode of the thin film transistor; forming an insulating layer exposing the first electrode; sequentially forming a hole injecting layer and a hole transporting layer stacked on the first electrode; forming red, green and blue emitting layer on the hole transporting layer, the red emitting layer being in the red sub-pixel, the green emitting layer being in the green sub-pixel, and the blue emitting layer being in the first and second blue sub-pixels; sequentially forming an electron transporting layer and an electron injecting layer sequentially stacked on the red, green and blue emitting layers; and forming a second electrode on the insulating layer and the electron injecting layer.

Preferably, the first blue sub-pixel may display a light-blue color, and the second blue sub-pixel may display a deep-blue color.

Preferably, the multi-layered structure may be a double-layered structure of the first electrode layer and a first metal layer under the first electrode layer, and the first metal layer may include Ag or Ag alloy, and wherein the first electrode layer may include ITO or IZO or other transparent conductive materials.

Preferably, the multi-layered structure may be a triple-layered structure of the first electrode layer, a first metal layer on the first electrode layer and a second metal layer on the first metal layer, and each of the first electrode layer and the second metal layer includes ITO or IZO or other transparent conductive materials, and wherein the first metal layer includes Ag or Ag alloy.

Preferably, the first electrode layer may have a thickness more than 0 angstrom and less than about 300 angstroms, and the first metal layer may have a thickness of about 100 to 200 angstroms.

Preferably, the first electrode layer may have a thickness more than 0 angstrom and less than about 300 angstroms, and the first metal layer may have a thickness of about 100 to 200 angstroms, and wherein the second metal layer may have a thickness more than 0 angstrom and less than about 100 angstroms.

Preferably, the blue emitting layer in the first and second blue sub-pixels may include the same blue phosphorescent organic material.

Preferably, the second electrode may include Al.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF PREFERRED EMBODIMENTS

Reference will now be made in detail to the preferred embodiments of the present invention, examples of which are illustrated in the accompanying drawings.

Figure 4:
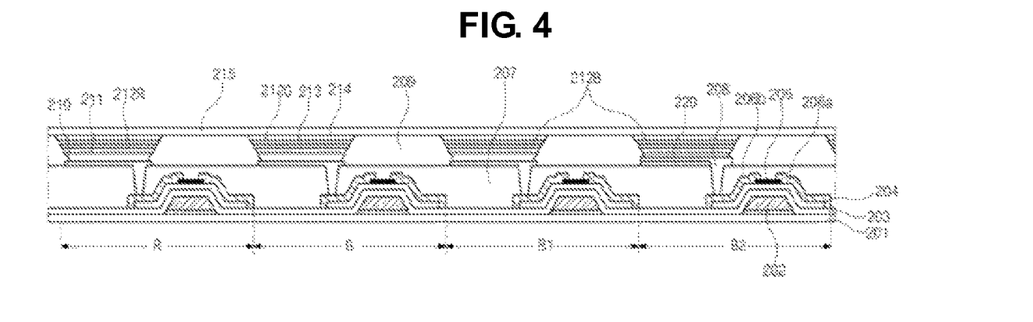
FIG. 4 is a schematic cross-sectional view of an OLED display device according to an exemplary embodiment of the present invention.

FIG. 4 is a schematic cross-sectional view of an OLED display device according to an exemplary embodiment of the present invention.

As shown in FIG. 4, a gate electrode 202 is formed on a substrate 201. For example, the gate electrode 202 may have a double-layered structure of molybdenum (Mo) and aluminum alloy (AlNd).

On the gate electrode 202, a gate insulating layer 203 is formed to cover the substrate 201.

On the gate insulating layer 203, an oxide semiconductor layer 204 is formed to correspond to a region where the gate electrode 202 is formed. For example, the oxide semiconductor layer 204 may be formed of an oxide semiconductor material such as indium-gallium-zinc-oxide (IGZO) or indium-tin-zinc-oxide (ITZO). The oxide semiconductor layer 204 may have a width larger than the gate electrode 202. On the oxide semiconductor layer 204, an etch-stopper 205 is formed to prevent damages on the oxide semiconductor layer 204 resulting from an etching process of a metallic material for source and drain electrodes. For example, the etch-stopper 205 may have substantially the same width as the gate electrode 202. The source and drain electrodes 206a and 206b are formed on the oxide semiconductor layer 204. The source and drain electrodes 206a and 206b are spaced apart from each other with the etch-stopper 205 therebetween.

The gate electrode 202, the gate insulating layer 203, the semiconductor layer 204, the etch-stopper 205, the source electrode 206a and the drain electrode 206b constitute a driving thin film transistor in each sub-pixel region. Although not shown, a plurality of gate lines and a plurality of data lines are formed on the substrate 201. The gate lines and the data lines cross each other to define the pixel regions. Each pixel region includes red, green, light-blue and deep-blue sub-pixels R, G, B1 and B2. In addition, a switching thin film transistor, which is connected to the gate line, the data line and the driving thin film transistor, is formed on the substrate and in each sub-pixel regions R, G, B1 and B2.

A first insulating layer 207 is formed on the substrate 201, where the source and drain electrodes 206a and 206b are formed, and a contact hole exposing the drain electrode 206b is formed through the first insulating layer 207. In a deep-blue sub-pixel B2, a first metal layer 220 is formed. The first metal layer 220 may be formed of Ag or Ag alloy.

Next, a first electrode layer 208 is formed on the first insulating layer 207 and the first metal layer 220. The first electrode layer 208 is electrically connected to the drain electrode 206b through the contact hole. The first electrode layer 208 may be formed of a transparent conductive material such as ITO or IZO or other transparent materials.

As a result, the first electrode layer 208 and the first metal layer 220 are formed in the deep-blue sub-pixel B2, and the first electrode layer 208 without the first metal layer 220 is formed in the red, green and light-blue sub-pixels R, G and B1. In other words, a first electrode in the deep-blue sub-pixel B2 has a double-layered structure of the first metal layer 220 and the first electrode layer 208, while a first electrode in the red, green and light-blue sub-pixel R, G and B1 has a single-layered structure of the first electrode layer 208.

After forming the first metal layer 220 and the first electrode layer 208, a second insulating layer 209 defining each of the sub-pixels R, G, B1 and B2 is formed, and a hole injecting layer 210 and a hole transporting layer 211 are sequentially formed on the first electrode layer 208 in each of the sub-pixels R, G, B1 and B2.

A red phosphorescent emitting layer 212R is formed on the hole transporting layer 211 in the red sub-pixel R, and a green phosphorescent emitting layer 212G is formed on the hole transporting layer 211 in the green sub-pixel G. In addition, a blue phosphorescent emitting layer 212B is formed on the hole transporting layer 211 in the light-blue sub-pixel B1 and the deep-blue sub-pixel B2.

For example, the red phosphorescent emitting layer 212R may include a host material such as carbazole biphenyl (CBP) or 1,3-bis(carbazol-9-yl) (mCP) and a dopant such as (bis(1-phenylisoquinoline)acetylacetonate iridium) (PIQIr(acac)), bis(1-henylquinoline)acetylacetonate iridium) (PQIr(acac)), (tris(1-phenylquinoline)iridium) (PQIr), or (octaethylporphyrin platinum) (PtOEP).

The green phosphorescent emitting layer 212G may include a host material such as CBP or mCP and a dopant such as fac-tris(2-phenylpyridine)iridium $(Ir(ppy)_3)$.

The blue phosphorescent emitting layer 212B may include a host material such as CBP or mCP and a dopant such as FIrpic ([bis(4,6-di-fluorophenyl)-pyridinato-N,C2']$_2$iridium).

However, the materials for the red, green and blue phosphorescent emitting layers 212R, 212G and 212B are not limited thereto.

On the red, green and blue phosphorescent emitting layers 212R, 212G and 212B, an electron transporting layer 213 and an electron injecting layer 214 are sequentially formed, and a second electrode layer 215 is formed to cover the electron injecting layer 214 and the second insulating layer 209. For example, the second electrode layer 215 may include aluminum (Al).

Figure 6:
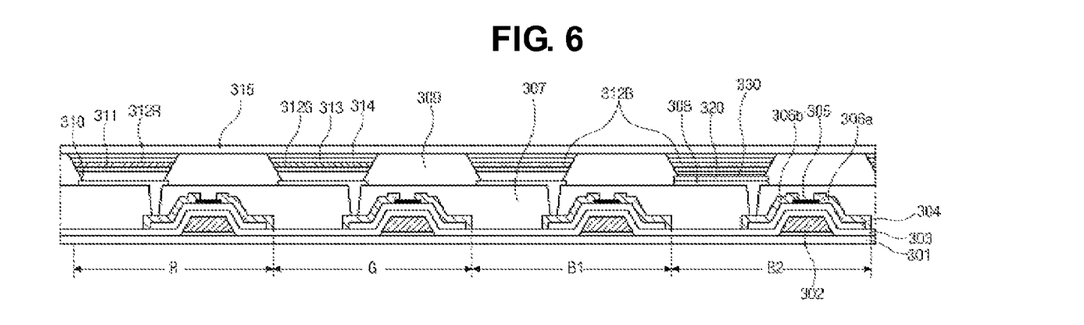
FIG. 6 is a schematic cross-sectional view of an OLED display device according to another exemplary embodiment of the present invention.

FIG. 6 is a schematic cross-sectional view of an OLED display device according to another exemplary embodiment of the present invention.

As shown in FIG. 6, a gate electrode 302 is formed on a substrate 301. For example, the gate electrode 302 may have a double-layered structure of molybdenum (Mo) and aluminum alloy (AlNd).

On the gate electrode 302, a gate insulating layer 303 is formed to cover the substrate 301.

On the gate insulating layer 303, an oxide semiconductor layer 304 is formed to correspond to a region where the gate electrode 302 is formed. For example, the oxide semiconductor layer 304 may be formed of an oxide semiconductor material such as indium-gallium-zinc-oxide (IGZO) or indium-tin-zinc-oxide (ITZO). The oxide semiconductor layer 304 may have a width larger than the gate electrode 302. On the oxide semiconductor layer 304, an etch-stopper 305 is formed to prevent damages on the oxide semiconductor layer 304 resulting from an etching process of a metallic material for source and drain electrodes. For example, the etch-stopper 305 may have substantially the same width as the gate electrode 302. The source and drain electrodes 306a and 306b are formed on the oxide semiconductor layer 304. The source and drain electrodes 306a and 306b are spaced apart from each other with the etch-stopper 305 therebetween.

A first insulating layer 307 is formed on the substrate 301, where the source and drain electrodes 306a and 306b are formed, and a contact hole 308h exposing the drain electrode 306b is formed through the first insulating layer 307. A first electrode layer 308 is deposited on the first insulating layer 307. The first electrode layer 308 is electrically connected to the drain electrode 306b through the contact hole. The first electrode layer 308 may be formed of a transparent conductive material such as ITO or IZO.

On the first electrode layer 308, a first metal layer 320 is deposited. The first metal layer 320 may be formed of Ag or Ag alloy.

Sequentially, a second metal layer 330 is deposited on the first metal layer 320. the second metal layer 330 may be formed of ITO or other transparent materials.

Next, by performing a half-tone mask process, the first electrode layer 308, the first metal layer 320 and the second metal layer 330 are formed in the deep-blue sub-pixel B2, and the first electrode 308 without the first and second metal layers 320 and 330 is formed in the red, green and blue sub-pixels R, G and B1. In other words, a first electrode in the deep-blue sub-pixel B2 has a triple-layered structure of the first electrode layer 308, the first metal layer 220 and the second metal layer 330, while a first electrode in the red, green and light-blue sub-pixel R, G and B1 has a single-layered structure of the first electrode layer 308.

After forming the first and second metal layers 320 and 330 and the first electrode layer 308, a second insulating layer 309 defining each of the sub-pixels R, G, B1 and B2, and a hole injecting layer 310 and a hole transporting layer 311 are sequentially formed on the second metal layer 330 in the deep-blue sub-pixel B2 and the first electrode layer 308 in each of the red, green and light-blue sub-pixels R, G and B1.

A red phosphorescent emitting layer 312R is formed on the hole transporting layer 311 in the red sub-pixel R, and a green phosphorescent emitting layer 312G is formed on the hole transporting layer 311 in the green sub-pixel G. In addition, a blue phosphorescent emitting layer 312B is formed on the hole transporting layer 311 in the light-blue sub-pixel B1 and the deep-blue sub-pixel B2.

For example, the red phosphorescent emitting layer 312R may include a host material such as carbazole biphenyl (CBP) or 1,3-bis(carbazol-9-yl) (mCP) and a dopant such as (bis(1-phenylisoquinoline)acetylacetonate iridium) (PIQIr(acac)), bis(1-henylquinoline)acetylacetonate iridium) (PQIr(acac)), (tris(1-phenylquinoline)iridium) (PQIr), or (octaethylporphyrin platinum) (PtOEP).

The green phosphorescent emitting layer 312G may include a host material such as CBP or mCP and a dopant such as fac-tris(2-phenylpyridine)iridium (Ir(ppy)$_3$).

The blue phosphorescent emitting layer 312B may include a host material such as CBP or mCP and a dopant such as FIrpic, (4,6-F2 ppy)$_2$Irpic, or L2BD111.

However, the materials for the red, green and blue phosphorescent emitting layers 312R, 312G and 312B are not limited thereto.

On the red, green and blue phosphorescent emitting layers 312R, 312G and 312B, an electron transporting layer 313 and an electron injecting layer 314 are sequentially formed, and a second electrode layer 315 is formed to cover the electron injecting layer 314 and the second insulating layer 209. For example, the second electrode layer 315 may include aluminum (Al).

Hereinafter, referring to FIGS. 5A to 5J, which are cross-sectional views showing fabricating processes of an OLED display device according to an exemplary embodiment of the present invention, a method of fabricating an OLED display device shown in FIG. 4 will be illustrated.

Figure 5A:
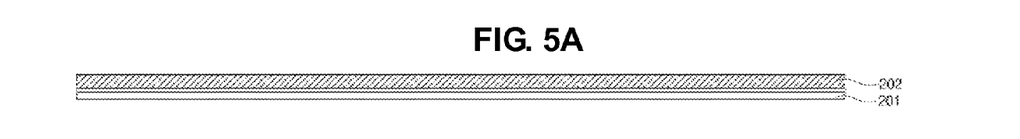
FIGS. 5A to 5J are cross-sectional views showing fabricating processes of an OLED display device according to an exemplary embodiment of the present invention.
Figure 5B:
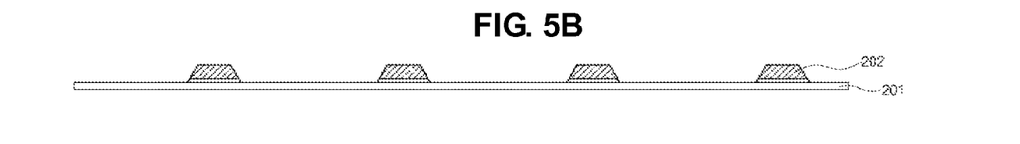

After depositing a metal layer for the gate electrode 202 on the substrate 201 as shown in FIG. 5A, the gate electrode 202 is formed by a mask process as shown in FIG. 5B. The gate electrode 202 has a double-layered structure of Mo and AlNd.

After sequentially depositing Mo and AlNd layers, the AlNd and Mo layers are sequentially etched to form the gate electrode 202.

Figure 5C:
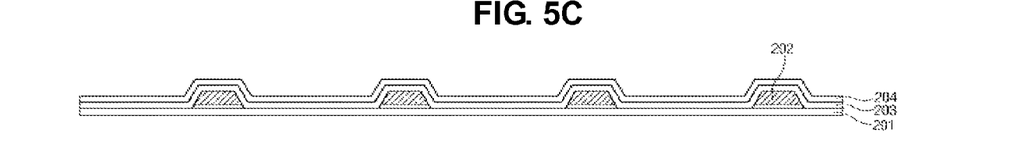

Next, as shown in FIG. 5C, the gate insulating layer 203 is formed on the substrate 201, where the gate electrode 202 is formed, and the oxide semiconductor material layer is formed on the gate insulating layer 203.

Figure 5D:
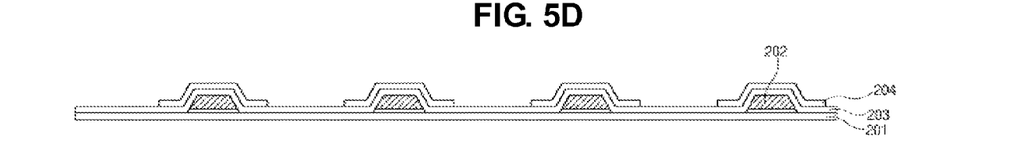

As shown in FIG. 5D, the oxide semiconductor layer is patterned by a mask process to form the oxide semiconductor layer 204 over the gate electrode 202. The oxide semiconductor layer 204 overlaps the gate electrode 202. The oxide semiconductor layer 204 may be formed of IGZO, ITZO or indium-aluminum-zinc-oxide (IAZO).

Figure 5E:
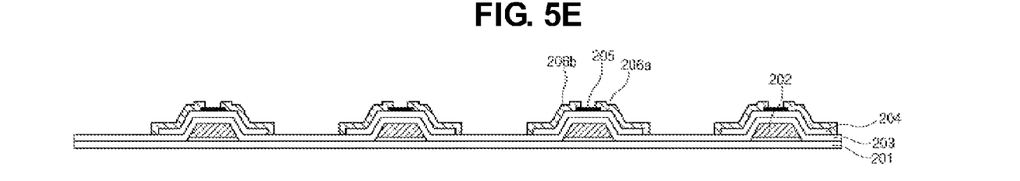

Next, as shown in FIG. 5E, the etch-stopper 205 is formed on the oxide semiconductor layer 204, and the source electrode 206a and the drain electrode 206b, which are spaced apart from each other with the etch-stopper 205 therebetween, are formed. The damages on the oxide semiconductor layer 204 resulting from an etching process for the source and drain electrodes 206a and 206b is prevented due to the etch-stopper 205.

Figure 5F:
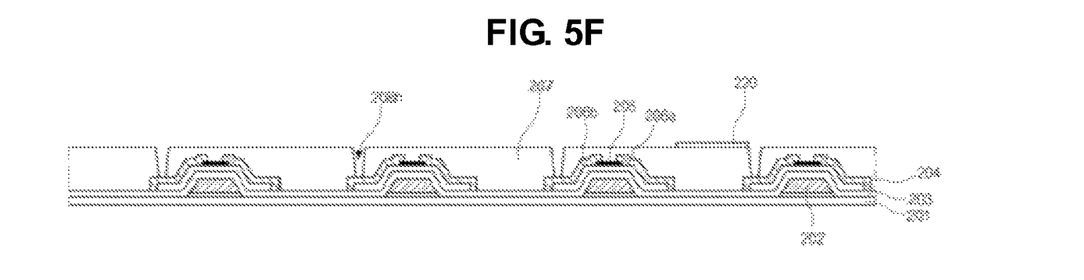

Next, as shown in FIG. 5F, after forming the source and drain electrodes 206a and 206b, the first insulating layer 207 is formed over the substrate 201. The first insulating layer 209 is patterned to form the contact hole for contacting the drain electrode 206b and the first electrode layer 208.

Next, the first metal layer 220 is formed on the first insulating layer 209 and in the deep-blue sub-pixel B2. The first metal layer 220 is formed of Ag or Ag alloy and has a thickness of about 100 to 200 angstroms.

Figure 5G:
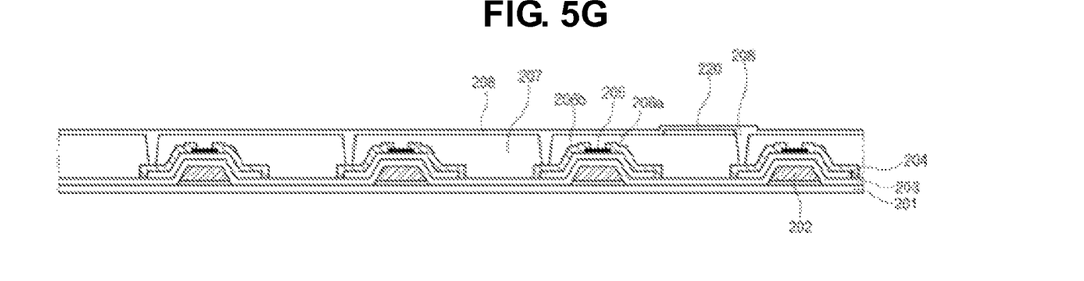

Next, as shown in FIG. 5G, the first electrode layer 208 is formed on the first insulating layer 209 and the first metal layer 220. For example, the first electrode layer 208 is formed of ITO or IZO or other transparent conductive materials and has a thickness more than 0 angstrom and less than about 300 angstroms. If the first metal layer 220 is too thick, the color of the deep blue light could be changed when passing through the first metal layer 220, because the present invention is bottom-emission type organic light emitting diode display device.

Figure 5H:
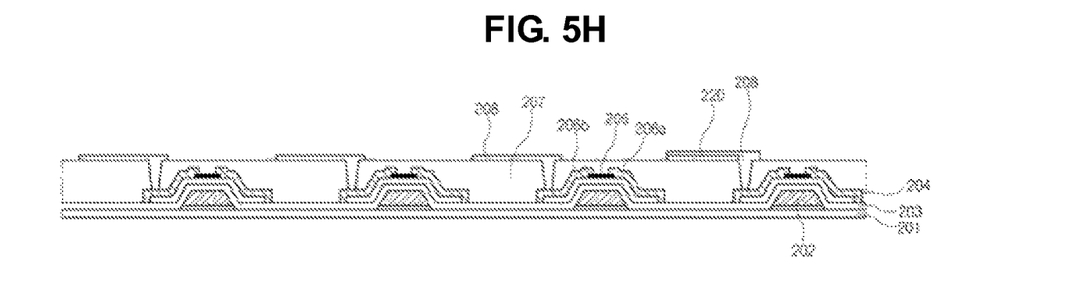

Next, as shown in FIG. 5H, by etching the first electrode layer 208, a double-layered structure of the first metal layer 220 and the first electrode layer 208 is formed in the deep-blue sub-pixel B2, and a single-layered structure of the first electrode layer 208 is formed in each of the red, green and light-blue sub-pixels R, G and B1.

Figure 5I:
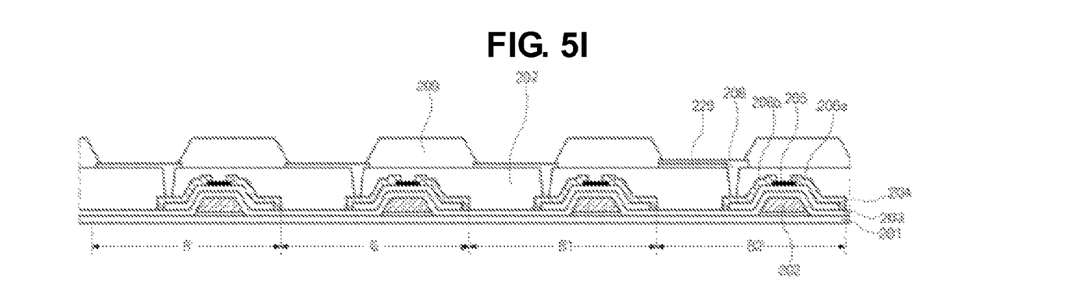

Next, as shown in FIG. 5I, the second insulating layer 209 is formed to define the sub-pixels R, G, B1 and B2.

Figure 5J:
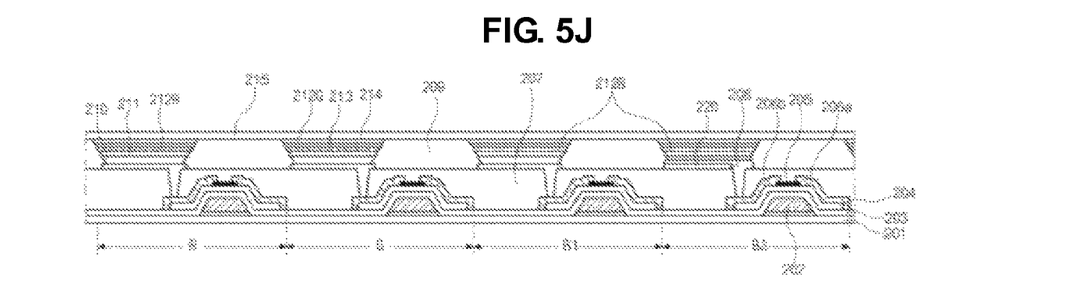

Next, as shown in FIG. 5J, the hole injecting layer 210, the hole transporting layer 211, the red, green and blue phosphorescent emitting layers 212R, 212G and 212B, the electron transporting layer 213, the electron injecting layer 214 and the second electrode 215 are formed. The red phosphorescent emitting layer 212R is formed in the red sub-pixel R, and the green phosphorescent emitting layer 212G is formed in the green sub-pixel G. The blue phosphorescent emitting layer 212B is formed in the light-blue sub-pixel B1 and the deep-blue sub-pixel B2. The second electrode layer 215 includes Al.

In the OLED shown in FIG. 6, the processes for fabricating the gate electrode to the first insulating layer are substantially same as the above-illustrated processes.

After forming the first insulating layer 307, the first electrode layer 308, the first metal layer 320 and the second metal layer 330 are sequentially deposited.

For example, the first electrode layer 308 includes ITO and has a thickness less than about 300 angstroms. If the first metal layer 320 is too thick, the color of the deep blue light could be changed when passing through the first metal layer 320, because the present invention is bottom-emission type organic light emitting diode display device. So the first metal layer 320 is desirable to include Ag or Ag alloy and to have a thickness of about 100 to 200 angstroms. The second metal layer 330 includes ITO and has a thickness more than 0 angstrom and less than about 100 But the present invention is not limited thereto.

Next, by etching the first electrode layer 308, the first metal layer 320 and the second metal layer 330 using a half-tone mask process, a triple-layered structure of the first electrode layer 308, the first metal layer 320 and the second metal layer 330 are formed in the deep-blue sub-pixel B2, and a single-layered structure of the first electrode 308 is formed in the red, green and blue sub-pixels R, G and B1.

Next, the hole injecting layer 310, the hole transporting layer 311, the red, green and blue phosphorescent emitting layers 312R, 312G and 312B, the electron transporting layer 313, the electron injecting layer 314 and the second electrode 315 are formed. The red phosphorescent emitting layer 312R is formed in the red sub-pixel R, and the green phosphorescent emitting layer 312G is formed in the green sub-pixel G. The blue phosphorescent emitting layer 312B is formed in the light-blue sub-pixel B1 and the deep-blue sub-pixel B2. The second electrode layer 315 includes Al.

The phosphorescent organic material has excellent efficiency and lifetime. When the same blue phosphorescent organic material is deposited in the light-blue region and the deep-blue region, the light-blue color of an inherent property of the phosphorescent organic material is displayed in the light-blue region. However, in the deep-blue region, a deep-blue color is displayed due to a micro-cavity effect induced between the first metal layer 220,320 on or under the first electrode layer 208,308 and the second electrode 215,315.

Deep blue light can be displayed by the micro-cavity effect that a specific wavelength of the light gets amplified by constructive reinforcement with reflecting repeatedly between the fi-rst metal layer 220,320 on or under the first electrode layer 208,308 and the second electrode 215,315 respectively. The specific wavelength can be decided by the distance between the first metal layer 220,320 and the second electrode 215,315.

Figure 7:
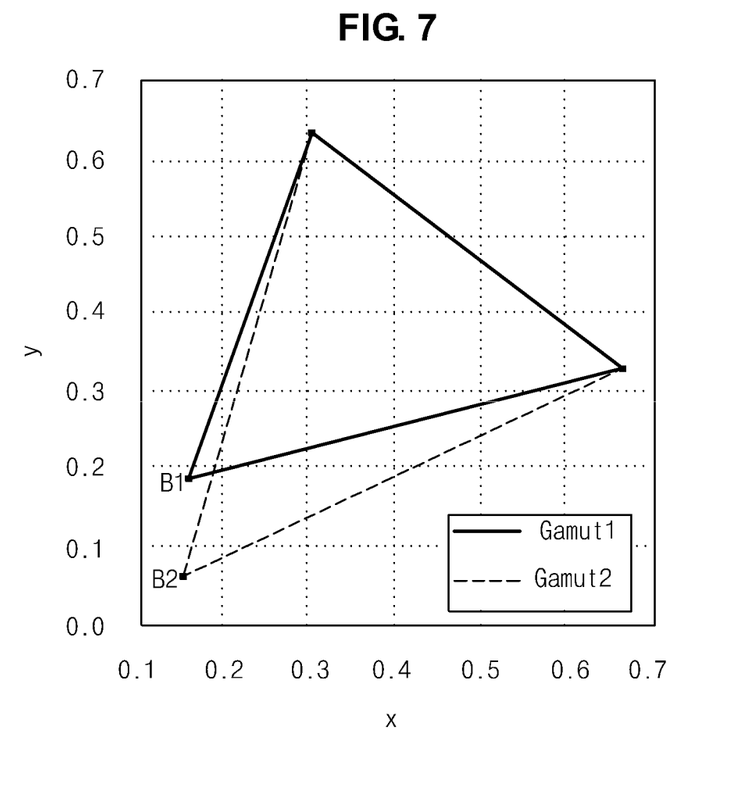
FIG. 7 is a color-coordinate of first and second blue colors in an OLED display device according to an exemplary embodiment of the present invention.

FIG. 7 is a color-coordinate of first and second blue colors in an OLED display device according to an exemplary embodiment of the present invention. The first blue color of the light-blue color is marked as "Gamut1", and the second blue color of the deep-blue color is marked as "Gamut2". With the same light-blue phosphorescent organic material used in the light-blue region and the deep-blue region, the color-coordinate of the light displayed in the light-blue region and the deep-blue region is different.

Table 1 shows the color-coordinate in FIG. 7.

TABLE 1

| 구조 | x | y |
|---|---|---|
| Gamut_B1 | 0.1597 | 0.1899 |
| Gamut_B2 | 0.1477 | 0.0624 |

In the CIE color-coordinate index, as CIE(y) is higher, the light-blue is displayed. Accordingly, "Gamut1" is the light-blue color, and "Gamut2" is the deep-blue color.

In the OLED display device and the method of fabricating the OLED display device of present invention, since the light-blue color and the deep-blue color are displayed using the same blue phosphorescent organic material by forming a metal layer of Ag or Ag alloy in the deep-blue sub-pixel, one step of depositing an organic material is omitted and power consumption is reduced. In addition, the OLED display device having an increased lifetime with the four-pixels can be provided.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode display device, comprising:
    a substrate;
    a plurality of pixel regions defined by a plurality of gate lines and a plurality of data lines formed on the substrate, each pixel region including red, green, first blue and second blue sub-pixels;
    a thin film transistor in each pixel region;
    a first electrode electrically connected to a drain electrode of each of the thin film transistors;
    an insulating layer exposing the first electrode;
    a hole injecting layer and a hole transporting layer sequentially stacked on the first electrode;
    red, green and blue emitting layers on the hole transporting layer, the red emitting layer being in the red sub-pixel, the green emitting layer being in the green sub-pixel, and the blue emitting layer being in the first and second blue sub-pixels;
    an electron transporting layer and an electron injecting layer sequentially stacked on the red, green, and blue emitting layers; and
    a second electrode on the insulating layer and the electron injecting layer,
    wherein the first electrode in the second blue sub-pixel has a multi-layered structure of the first electrode layer and at least one metal layer; and
    wherein the first electrode in the first blue sub-pixel has a single-layered structure of the first electrode layer.

2. The device according to claim 1, wherein the first blue sub-pixel displays a light-blue color, and the second blue sub-pixel displays a deep-blue color.

3. The device according to claim 1, wherein the multi-layered structure is a double-layered structure of the first electrode layer and a first metal layer under the first electrode layer, and the first metal layer includes Ag or Ag alloy, and wherein the first electrode layer includes ITO or IZO or other transparent conductive materials.

4. The device according to claim 1, wherein the multi-layered structure is a triple-layered structure of the first electrode layer, a first metal layer on the first electrode layer and a second metal layer on the first metal layer, and each of the first electrode layer and the second metal layer includes ITO or IZO or other transparent conductive materials, and wherein the first metal layer includes Ag or Ag alloy.

5. The device according to claim 3, wherein the first electrode layer has a thickness more than 0 angstrom and less than about 300 angstroms, and the first metal layer has a thickness of about 100 to 200 angstroms.

6. The device according to claim 4, wherein the first electrode layer has a thickness more than 0 angstrom and less than about 300 angstroms, and the first metal layer has a thickness of about 100 to 200 angstroms, and wherein the second metal layer has a thickness more than 0 angstrom and less than about 100 angstroms.

7. The device according to claim 1, wherein the blue emitting layer in the first and second blue sub-pixels includes the same blue phosphorescent organic material.

8. The device according to claim 1, wherein the second electrode includes Al.

9. A substrate for an organic light emitting diode display device, comprising:
   a substrate;
   a plurality of pixel regions defined by a plurality of gate lines and a plurality of data lines formed on the substrate, each pixel region including red, green, first blue, and second blue sub-pixels;
   a thin film transistor in each pixel region;
   a first electrode electrically connected to a drain electrode of the thin film transistor;
   an insulating layer exposing the first electrode;
   a hole injecting layer and a hole transporting layer sequentially stacked on the first electrode;
   red, green, and blue emitting layers on the hole transporting layer, the red emitting layer being in the red sub-pixel, the green emitting layer being in the green sub-pixel, and the blue emitting layer being in the first and second blue sub-pixels;
   an electron transporting layer and an electron injecting layer sequentially stacked on the red, green, and blue emitting layers; and
   a second electrode on the insulating layer and the electron injecting layer,
   wherein the first electrode in the second blue sub-pixel has a multi-layered structure of the first electrode layer and at least one metal layer; and
   wherein the first electrode in the first blue sub-pixel has a single-layered structure of the first electrode layer.

10. The substrate according to claim 9, wherein the multi-layered structure is a double-layered structure of the first electrode layer and a first metal layer under the first electrode layer, or a triple-layered structure of the first electrode layer, a first metal layer on the first electrode layer and a second metal layer on the first metal layer.

11. The substrate according to claim 9, wherein the blue emitting layer in the first and second blue sub-pixels includes the same blue phosphorescent organic material.

12. A method of fabricating an organic light emitting diode display device, comprising:
   providing a substrate;
   forming, on the substrate, a plurality of gate lines and a plurality of data lines to define a plurality of pixel regions, each pixel region including red, green, first blue, and second blue sub-pixels;
   forming a thin film transistor in each pixel region;
   forming a first electrode electrically connected to a drain electrode of the thin film transistor in each pixel region;
   forming an insulating layer exposing the first electrode;
   sequentially forming a hole injecting layer and a hole transporting layer stacked on the first electrode;
   forming red, green, and blue emitting layers on the hole transporting layer, the red emitting layer being in the red sub-pixel, the green emitting layer being in the green sub-pixel, and the blue emitting layer being in the first and second blue sub-pixels;
   sequentially forming an electron transporting layer and an electron injecting layer sequentially stacked on the red, green, and blue emitting layers; and
   forming a second electrode on the insulating layer and the electron injecting layer,
   wherein the first electrode in the second blue sub-pixel has a multi-layered structure of the first electrode layer and at least one metal layer; and
   wherein the first electrode in the first blue sub-pixel has a single-layered structure of the first electrode layer.

13. The method according to claim 12, wherein the first blue sub-pixel displays a light-blue color, and the second blue sub-pixel displays a deep-blue color.

14. The method according claim 12, wherein the multi-layered structure is a double-layered structure of the first electrode layer and a first metal layer under the first electrode layer, and the first metal layer includes Ag or Ag alloy, and wherein the first electrode layer includes ITO or IZO or other transparent conductive materials.

15. The method according claim 12, wherein the multi-layered structure is a triple-layered structure of the first electrode layer, a first metal layer on the first electrode layer and a second metal layer on the first metal layer, and each of the first electrode layer and the second metal layer includes ITO or IZO or other transparent conductive materials, and wherein the first metal layer includes Ag or Ag alloy.

16. The method according claim 14, wherein the first electrode layer has a thickness more than 0 angstrom and less than about 300 angstroms, and the first metal layer has a thickness of about 100 to 200 angstroms.

17. The method according claim 15, wherein the first electrode layer has a thickness more than 0 angstrom and less than about 300 angstroms, and the first metal layer has a thickness of about 100 to 200 angstroms, and wherein the second metal layer has a thickness more than 0 angstrom and less than about 100 angstroms.

18. The method according claim 12, wherein the blue emitting layer in the first and second blue sub-pixels includes the same blue phosphorescent organic material.

19. The method according to claim 12, wherein the second electrode includes Al.

20. The device according to claim 1, wherein the first electrode in the red sub-pixel and the green sub-pixel also has a single-layered structure of the first electrode layer; and
   wherein the at least one metal layer is not present in the red sub-pixel, the green sub-pixel, and the first blue sub-pixel.

21. The substrate according to claim 9, wherein the first electrode in the red sub-pixel and the green sub-pixel also has a single-layered structure of the first electrode layer; and
   wherein the at least one metal layer is not present in the red sub-pixel, the green sub-pixel, and the first blue sub-pixel.

22. The method according to claim 12, wherein the first electrode in the red sub-pixel and the green sub-pixel also has a single-layered structure of the first electrode layer; and
   wherein the at least one metal layer is not present in the red sub-pixel, the green sub-pixel, and the first blue sub-pixel.

* * * * *